United States Patent
Zhang et al.

(10) Patent No.: US 11,423,993 B2
(45) Date of Patent: Aug. 23, 2022

(54) BI-DIRECTIONAL SENSING IN A MEMORY

(71) Applicant: SanDisk Technologies LLC, Addison, TX (US)

(72) Inventors: Zhiping Zhang, San Jose, CA (US); Muhammad Masuduzzaman, San Jose, CA (US); Huai-Yuan Tseng, San Jose, CA (US); Peng Zhang, San Jose, CA (US); Dengtao Zhao, San Jose, CA (US); Deepanshu Dutta, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/676,023

(22) Filed: Nov. 6, 2019

(65) Prior Publication Data

US 2021/0134372 A1    May 6, 2021

(51) Int. Cl.
| | | |
|---|---|---|
| *G11C 16/26* | (2006.01) | |
| *G11C 16/10* | (2006.01) | |
| *G11C 16/34* | (2006.01) | |
| *G06F 3/06* | (2006.01) | |
| *G11C 16/04* | (2006.01) | |

(52) U.S. Cl.
CPC ............ *G11C 16/26* (2013.01); *G06F 3/0604* (2013.01); *G06F 3/0659* (2013.01); *G06F 3/0673* (2013.01); *G11C 16/10* (2013.01); *G11C 16/3431* (2013.01); *G11C 16/3459* (2013.01); *G11C 16/0483* (2013.01)

(58) Field of Classification Search
CPC ..... G11C 16/26; G11C 16/10; G11C 16/3431; G11C 16/0483; G11C 16/33459; G06F 3/0604; G06F 3/0673

USPC ............................................ 365/185.21, 205
See application file for complete search history.

(56) References Cited

U.S. PATENT DOCUMENTS

| | | | |
|---|---|---|---|
| 6,166,951 A | 12/2000 | Derhacobian et al. | |
| 7,243,185 B2 * | 7/2007 | See et al. ................ | G06F 12/00 |
| 7,688,612 B2 * | 3/2010 | Lee et al. ................ | G11C 5/06 |
| 10,971,240 B1 * | 4/2021 | Dunga et al. ........ | G11C 16/344 |

(Continued)

OTHER PUBLICATIONS

International Search Report and Written Opinion, PCT/US2020/024405, dated Jul. 27, 2020.

*Primary Examiner* — Connie C Yoha
(74) *Attorney, Agent, or Firm* — Dickinson Wright PLLC; Steven C. Hurles

(57) ABSTRACT

A method reading memory using bi-directional sensing, including programming first memory cells coupled to a first word-line using a normal programming order; programming second memory cells coupled to a second word-line using a normal programming order; reading data from the first memory cells by applying a normal sensing operation to the first word-line; and reading data from the second memory cells by applying a reverse sensing operation to the second word-line. Methods also include receiving an error associated with reading data from the first memory cells; and then reading the data from the first memory cells by applying a reverse sensing operation to the first word-line. Method also include receiving an error associated with reading the data from the second memory cells; and then reading the data from the second memory cells by applying a normal sensing operation to the second word-line.

20 Claims, 11 Drawing Sheets

(56) References Cited

U.S. PATENT DOCUMENTS

| | | | |
|---|---|---|---|
| 2007/0047307 A1* | 3/2007 | Ogura | G11C 16/0475 |
| | | | 365/185.11 |
| 2007/0147141 A1 | 6/2007 | Shibata | |
| 2008/0084754 A1* | 4/2008 | Mokhlesi | G11C 16/06 |
| 2009/0080265 A1* | 3/2009 | Mokhlesi | G11C 16/26 |
| | | | 365/185.23 |
| 2010/0046302 A1* | 2/2010 | Ogura | G11C 11/5642 |
| | | | 365/185.21 |
| 2013/0163330 A1 | 6/2013 | Sharon | |
| 2013/0294169 A1 | 11/2013 | Sharon et al. | |
| 2014/0133229 A1* | 5/2014 | Kamei | G11C 11/4097 |
| | | | 365/185.11 |
| 2016/0099069 A1 | 4/2016 | Chen et al. | |
| 2018/0233200 A1 | 8/2018 | Sakui et al. | |
| 2021/0012841 A1* | 1/2021 | Yanagidaira | H01L 27/11565 |

\* cited by examiner

BI-DIRECTIONAL SENSING IN A MEMORY

BACKGROUND

The present technology relates to the operation of memory devices.

Semiconductor memory devices are widely used in various electronic devices such as a laptop, a digital audio player, a digital camera, a cellular phone, a video game console, a scientific instrument, an industrial robot, medical electronics, a solid state drive, and a USB. Semiconductor memory includes both non-volatile and volatile memory. Non-volatile memory retains stored information without requiring an external power source. Examples of non-volatile memory include flash memory (e.g., NAND-type and NOR-type flash memory) and Electrically Erasable Programmable Read-Only Memory (EEPROM).

A semiconductor memory device may be implemented using charge-storing material such as a floating gate or a charge-trapping material, where stored charge represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which includes a stack of alternating conductive and dielectric layers.

A memory device includes memory cells which may be arranged in strings, for instance, where select gate transistors are provided at the ends of the string to selectively connect a channel of the string to a source line or bit line. However, various challenges are presented in operating such memory devices.

SUMMARY

Various embodiments include a method of reading a memory using bi-directional sensing, including: programming first memory cells coupled to a first word-line using a normal programming order; programming second memory cells coupled to a second word-line using a normal programming order; reading data from the first memory cells by applying a normal sensing operation to the first word-line; and reading data from the second memory cells by applying a reverse sensing operation to the second word-line.

Other embodiments include a memory controller, including: a first terminal coupled to a memory array; the memory controller configured to: program first memory cells coupled to a first word-line using a normal programming order; program second memory cells coupled to a second word-line using a normal programming order; read data from the first memory cells by applying a normal sensing operation to the first word-line; and read data from the second memory cells by applying a reverse sensing operation to the second word-line.

Additional embodiments include a non-volatile storage system, configured to perform bi-directional sensing to read a memory, including: a memory array that is a three-dimensional memory array; a controller coupled to the memory array, where the controller is configured to: program first memory cells coupled to a first word-line using a normal programming order; program second memory cells coupled to a second word-line using a normal programming order; read data from the first memory cells by applying a reverse sensing operation to the first word-line; and read data from the second memory cells by applying a normal sensing operation to the second word-line.

BRIEF DESCRIPTION OF THE DRAWINGS

For a detailed description of example embodiments, reference will now be made to the accompanying drawings in which.

DETAILED DESCRIPTION

Figure 1:
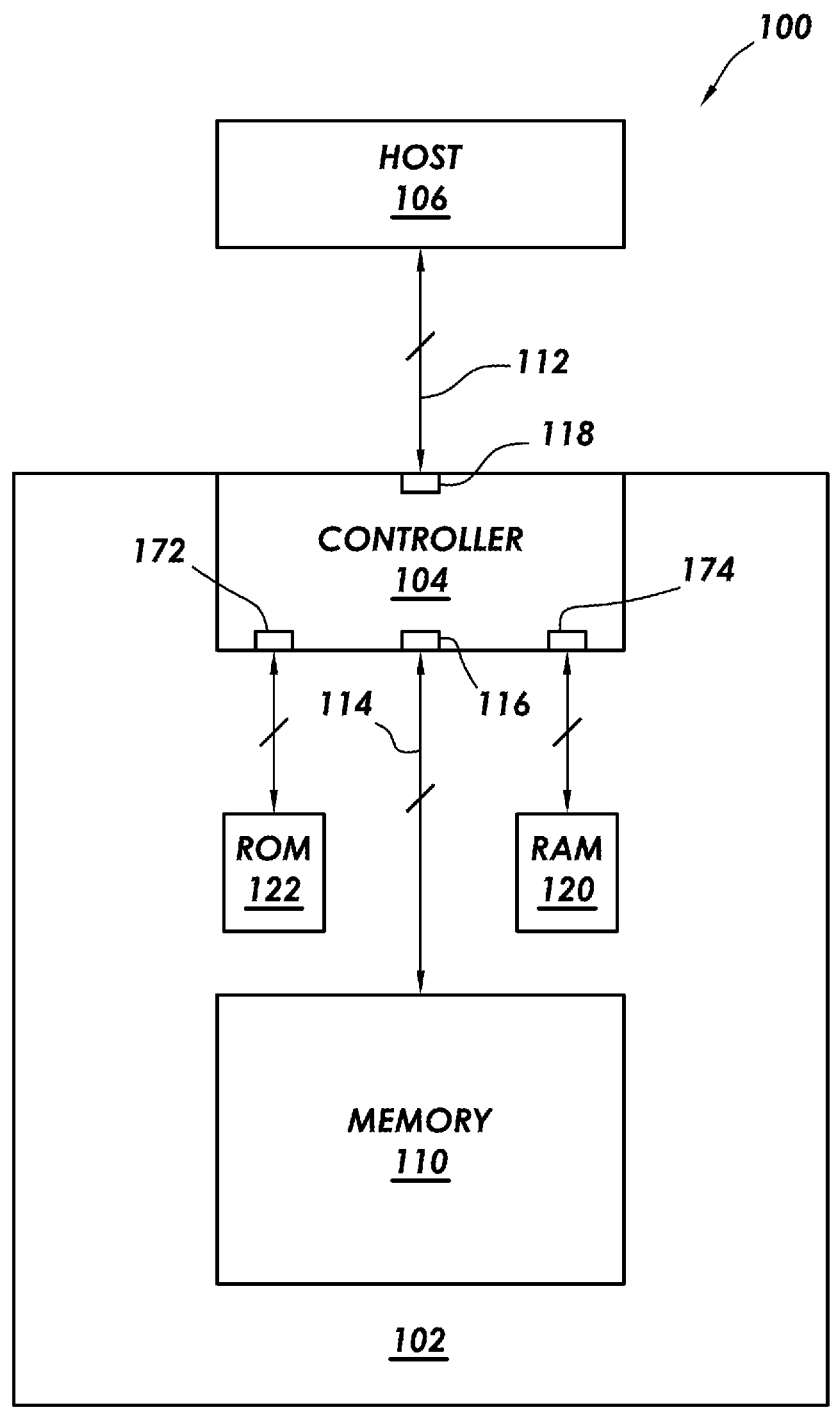
FIG. 1 illustrates a block diagram of an example non-volatile memory system, in accordance with some embodiments.

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Various terms are used to refer to particular system components. Different companies may refer to a component by different names—this document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections.

Additionally, when a layer or element is referred to as being "on" another layer or substrate, in can be directly on the other layer of substrate, or intervening layers may also be present. Further, it will be understood that when a layer is referred to as being "under" another layer, it can be directly under, and one or more intervening layers may also be present. Furthermore, when a layer is referred to as "between" two layers, it can be the only layer between the two layers, or one or more intervening layers may also be present.

As described herein, a controller includes individual circuit components, an application-specific integrated circuit (ASIC), a microcontroller with controlling software, a digital signal processor (DSP), a processor with controlling software, a field programmable gate array (FPGA), or combinations thereof.

As described herein, methods are described for reading a memory using bi-directional sensing, including: programming first memory cells coupled to a first word-line using a normal programming order; programming second memory cells coupled to a second word-line using a normal programming order; reading data from the first memory cells by applying a normal sensing operation to the first word-line; and reading data from the second memory cells by applying a reverse sensing operation to the second word-line.

In some embodiments, bi-directional sensing includes a smart sensing operation used in scenarios where a neighboring word-line interference impacts a read operation. In additional embodiments, a memory cell is read using bi-directional sensing based on a location of the word-line coupled to the memory cell. For example, a word-line disposed along the edge of the memory may be read using a normal sensing operation while a word-line disposed in the middle of the memory may be read using a reverse sensing operation.

The description turns to describing an example memory system and then turns to various aspects associated with bi-directional sensing in a memory. In particular, FIGS. 1-4 and 10 describe aspects of an example memory system, while FIGS. 5-9 describes aspects of reading the memory.

FIG. 1 illustrates a block diagram of an example system architecture 100 including non-volatile memory "NVM" array 110 (hereinafter "memory 110"). In particular, the example system architecture 100 includes storage system 102 where a host 106 is communicatively coupled to the memory 110 by way of a controller 104. The controller 104 is communicatively coupled to the host 106 by bus 112 (by way of port 118), additionally the controller 104 is communicatively coupled to the memory 110 by bus 114 (by way of port 116).

The ports 116 and 118 of the controller can include one or several channels coupling the memory 110 or the host 106, respectively. Furthermore, the buses 112 and 114 are implemented by several channels (e.g., physical connections). The depiction of a single bus is not meant to be limiting as one or more connections and interfaces can be used to communicatively couple the same components.

In some examples, the bus 112 implements any known or after developed communication protocol that enables the storage system 102 and the host 106 to communicate. Some non-limiting examples of a communication protocol include Secure Digital (SD) protocol, Memory Stick (MS) protocol, Universal Serial Bus (USB) protocol, or Advanced Microcontroller Bus Architecture (AMBA). In some examples, the interface 114 implements any known or after developed communication protocol. In embodiments where the storage system 102 is flash memory, the interface 114 is a flash interface, such as Toggle Mode 200, 400, or 800, or Common Flash Memory Interface (CFI).

In FIG. 1, the controller 104 is coupled to a random access memory (RAM) 120 (by RAM port 174) and a read only memory (ROM) 122 (by ROM port 172). Although in FIG. 1 the RAM 120 and the ROM 122 are shown as separate modules within the storage system 102, in some embodiments, the RAM 120 and the ROM 122 are located within the controller 104. In other cases, portions of the RAM 120 or ROM 122, can be located outside the controller 104. In other embodiments, the controller 104, the RAM 120, and the ROM 122 are located on separate semiconductor die.

The memory 110 of the storage system 102 includes several memory die, where a memory die can be defined in various ways. In one example, the memory 110 defines a physical set of memory die. In other embodiments, the memory 110 defines a logical set of memory die, where the memory 110 includes memory die from several physically different sets of memory die.

The memory 110 includes memory cells defined within the memory die that can be solid-state memory cells (e.g., flash), one-time programmable, few-time programmable, or many time programmable. Additionally, the memory cells in the memory die 110 can include single-level cells (SLC), multi-level cells (MLC), or triple-level cells (TLC). In some embodiments, the memory cells are fabricated in a planar manner (e.g., 2D NAND (NOT-AND) flash) or in a stacked or layered manner (e.g., 3D NAND flash). Furthermore, the memory cells can use charge-storing material such as floating gate or a charge-trapping material, where stored charge represents a data state.

In various embodiments, the host 106 includes any device or system that utilizes the storage system 102—e.g., a computing device, a memory card, a flash drive. In some example embodiments, the storage system 102 is embedded within the host 106—e.g., a solid state disk (SSD) drive installed in a laptop computer. In additional embodiments, the system architecture 100 is embedded within the host 106 such that the host 106 and the storage system 102 including the controller 104 are formed on a single integrated circuit chip. In embodiments where the system architecture 100 is implemented within a memory card, the host 106 can include a built-in receptacle or adapters for one or more types of memory cards or flash drives (e.g., a universal serial bus (USB) port, or a memory card slot).

Although, the storage system 102 includes its own memory controller and drivers (e.g., controller 104)—as will be described further below in FIG. 10—the example described in FIG. 1 is not meant to be limiting. Other embodiments of the storage system 102 include memory-only units that are instead controlled by software executed by a controller on the host 106 (e.g., a processor of a computing device controls—including error handling of—the storage unit 102). Additionally, any method described herein as being performed by the controller 104 can also be performed by the controller of the host 106.

Still referring to FIG. 1, the host 106 includes its own controller (e.g., a processor) configured to execute instructions stored in the storage system 102 and further the host 106 accesses data stored in the storage system 102, referred to herein as "host data". The host data includes data originating from and pertaining to applications executing on the host 106. In one example, the host 106 accesses host data stored in the storage system 102 by providing a logical address to the controller 104 which the controller 104 converts to a physical address. The controller 104 accesses the data or particular storage location associated with the physical address and facilitates transferring data between the storage system 102 and the host 106.

In embodiments where the storage system 102 includes flash memory, the controller 104 formats the flash memory to ensure the memory is operating properly, maps out bad flash memory cells, and allocates spare cells to be substituted for future failed cells or used to hold firmware to operate the flash memory controller (e.g., the controller 104). Furthermore, the controller 104 can implement bi-directional sensing to read data in the memory 110 as described herein. Thus, the controller 104 performs various memory management functions such as b-directional sensing (as described herein), wear leveling (e.g., distributing writes to extend the lifetime of the memory blocks), garbage collection (e.g., moving valid pages of data to a new block and erasing the previously used block), and error detection and correction (e.g., read error handling).

The technology described herein can also be utilized with technologies in addition to the charge trapping and floating gate flash memory described herein. For example, in addition to flash memory (e.g., 2D and 3D NAND-type and NOR-type flash memory), examples of non-volatile memory include ReRAM memories, magnetoresistive memory (e.g., MRAM), and phase change memory (e.g., PCRAM). A person of ordinary skill in the art will recognize that this technology is not limited to a single specific memory structure, but covers many relevant memory structures within the spirit and scope of the technology as described herein and as understood by one of ordinary skill in the art.

An example three-dimensional memory is described next. Additional details of an example BiCS memory are described in FIGS. 3 and 4. While details specific to bi-directional sensing are described with respect to FIG. 4-8. As described herein, given the structure of three-dimensional memory and as the memory structure shrinks, issues related to neighboring word-line interference increases. For example, neighboring word-line interference can cause high bit error rates during a read operation performed on the memory 110. Methods directed to bi-directional sensing reduce the errors encountered during a read that can be caused by neighboring word-line interference.

Figure 2:
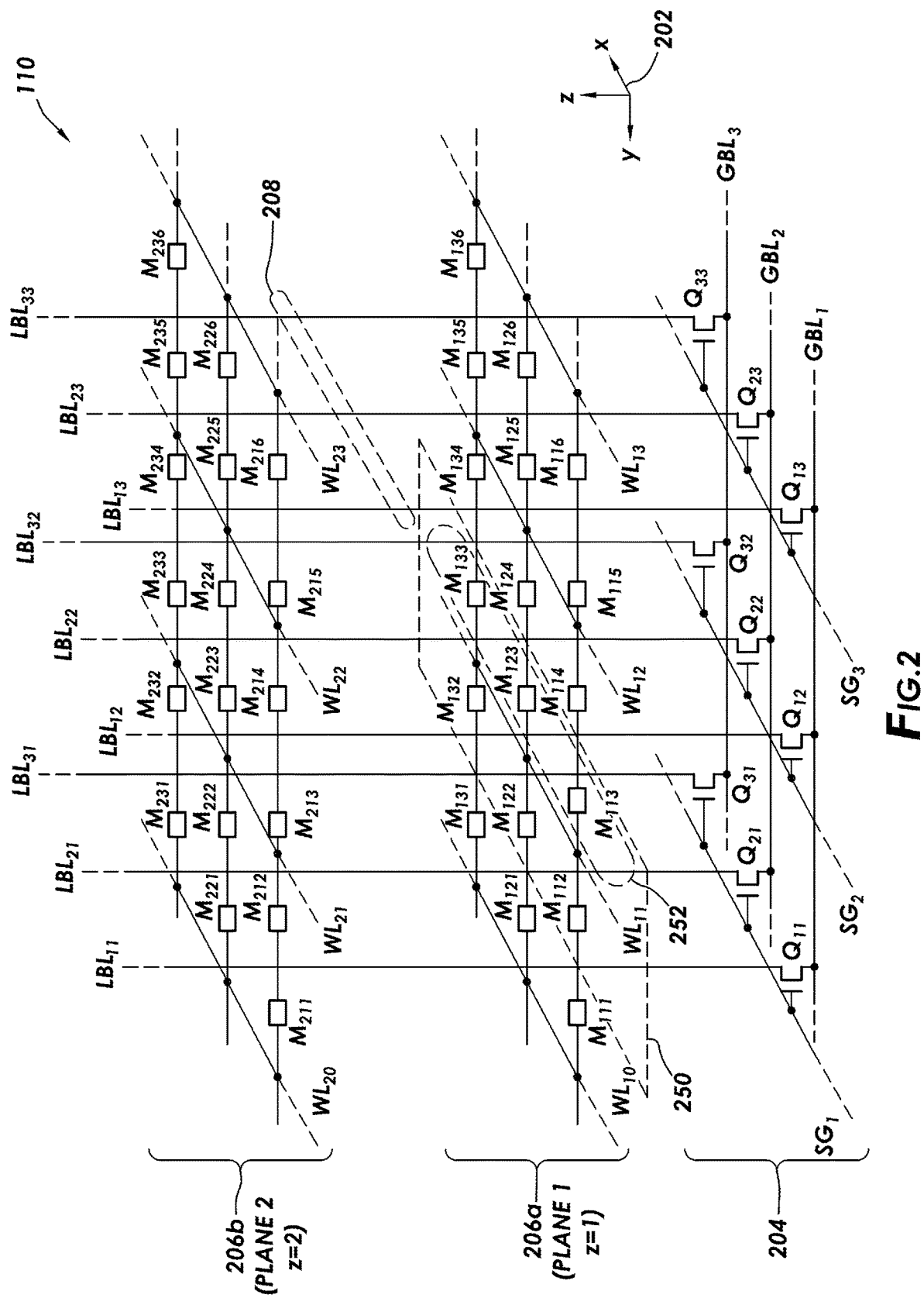
FIG. 2 illustrates an example architecture on an example three-dimensional memory, in the form of an equivalent circuit of a portion of such memory, in accordance with some embodiments.

FIG. 2 illustrates an architecture of a three-dimensional memory in schematic form of an equivalent circuit of a portion of memory 110. A coordinate system 202 is used for reference, where the directions for vectors x, y, and z are illustrated. Each of the vectors x, y, and z are orthogonal with the other two.

The three-dimensional memory includes a substrate layer 204, and one or more planes of memory 206a and 206b. The substrate layer 204 defines one or more circuits for selectively connecting internal memory elements with external data circuits. Each of the planes of memory 206 includes several memory storage elements $M_{zxy}$.

In particular, the substrate layer 204 includes a two-dimensional array of selecting devices or switches $Q_{xy}$, where x defines a relative position of the device in the x-direction and y defines a relative position of the device in the y-direction. In one embodiment, the individual devices $Q_{xy}$ are select gates or select transistors.

Global bit lines ($GBL_x$) are elongated in the y-direction and each $GBL_x$ is disposed in different positions in the x-direction that are indicated by the subscript. Each of the global bit lines ($GBL_x$) is selectively coupled to a respective selecting devices $Q_{xy}$, where a selecting device $Q_{xy}$ shares the same position in the x-direction as the respective global bit line ($GBL_x$) that it couples. As illustrated in FIG. 2, multiple selecting devices $Q_{xy}$ are coupled to a respective global bit line ($GBL_x$) along the y-direction.

Each of the selecting devices $Q_{xy}$ selectively couples a respective local bit line ($LBL_{xy}$). The local bit line ($LBL_{xy}$) are elongated vertically, in the z-direction, and form a regular two-dimensional array in the x (row) and y (column) directions. For purposes of this discussion, a set of local bit lines ($LBL_{xy}$)—e.g., the set 208 of $LBL_{x3}$ is defined as a group of local bit lines ($LBL_{xy}$) coupling respective global bit lines ($GBL_x$) in the x-direction.

Each of the sets of $LBL_{xy}$ is selectively coupled to a respective control or select gate lines ($SG_y$). For example, the set 208 of $LBL_{x3}$ is coupled to the select gate line $SG_3$. Each of the select gate lines ($SG_y$) is elongated in the x-direction and selectively couples a corresponding set of local bit lines ($LBL_{xy}$) to the global bit line ($GBL_x$).

In various embodiments, during reading or programming, only one select device $Q_{xy}$ is turned on at a time. Accordingly, during a reading or programming, one row or local bit lines ($LBL_{xy}$) of a set of $LBL_{xy}$ is coupled to a global bit line ($GBL_x$). During an example read or program operation, the select device $Q_{13}$ receives a voltage that makes the select device $Q_{13}$ conductive. The other select devices $Q_{23}$ and $Q_{33}$ receive voltages such that the select device $Q_{23}$ and $Q_{33}$ remain non-conductive. Thus, in this example, the global bit line ($GBL_1$) couples the local bit line ($LBL_{13}$) by way of the select device $Q_{13}$. In some embodiments, as one select device ($Q_{xy}$) is used with each of the local bit line ($LBL_{xy}$), the pitch of the array across the semiconductor substrate in both x and y-directions is made very small, and thus the density of the memory storage elements is increased.

Still referring to FIG. 2, the memory storage elements $M_{zxy}$ are formed in a plurality of planes positioned at different distances in the z-direction above the substrate 204. For purposes of this discussion, two planes 206a and 206b are illustrated in the portion of memory 110. Plane 206a is disposed along the x-y plane having a value in the z-direction of 1. Plane 206b is similarly disposed along the x-y plane having a value in the z-direction of 2.

In each of the planes 206, word-line $WL_{zy}$ are elongated in the x-direction and spaced apart in the y-direction between the local bit lines ($LBL_{xy}$). Individual word-lines $WL_{zy}$ may physically be made up of one continuous material that is coupled to several different memory elements $Mz_{xy}$. And individual memory elements $M_{zxy}$ are accessed by way of one local bit line ($LBL_{xy}$) and a word-line ($WL_{zy}$). As used herein, memory elements may also be referred to as memory cells or cells. A memory element $M_{zxy}$ is addressable by placing proper voltages on the local bit line ($LBL_{xy}$) and word-line ($WL_{zy}$) that couples the memory element $M_{zxy}$. During a program operation, voltages are applied that provide an appropriate amount of electrical stimulus that causes the state of the memory element to change to a desired value.

In various embodiments, each plane 206 is formed of at least two layers, one is a conductive layer that defines a word-line ($WL_{zy}$), and the second is a dielectric layer that electrically isolates the planes 206 from each other. The combined two layers is referred to as a word-line pitch. Additional layers may be present in each plane.

The planes 206 are stacked vertically on top of the substrate 204 layer, where each of the local bit lines ($LBL_{xy}$) extends perpendicular to each of the planes 206 to connect respective memory elements $M_{zxy}$ in each of the planes 206.

In FIG. 2, in various embodiments, a memory block is defined by a group of memory elements M. In one example, a block of memory is the smallest unit of memory elements $M_{axy}$ that can be erased together. In one example, a memory block includes the memory elements $M_{zxy}$ coupled on either side of one word-line, or a portion of a word-line in scenarios where word-lines are segmented. In FIG. 2, an example memory block 250 includes the memory elements $M_{zxy}$ coupled on either side, to the word-line $WL_{11}$, and includes the memory elements $M_{111}$, $M_{122}$, $M_{132}$, $M_{113}$, $M_{123}$, and $M_{133}$.

Additionally, in some embodiments, a memory page is defined as the memory elements $M_{zxy}$ along one side of a word-line. In FIG. 2, an example memory page 252 is defined as the memory elements along one side of the word-line $WL_{11}$, and includes the memory elements $M_{133}$, $M_{123}$, and $M_{113}$.

Figure 3:
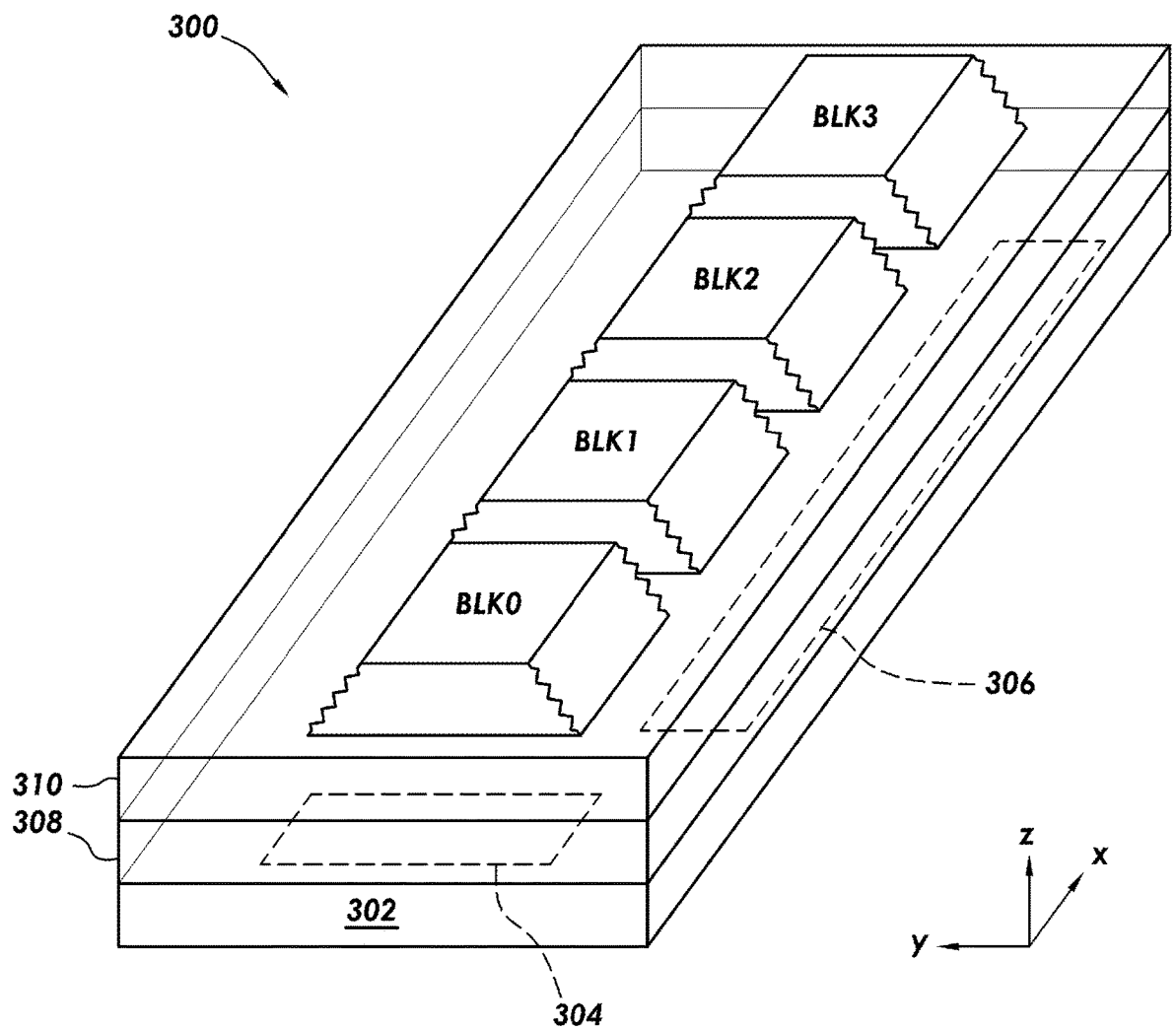
FIG. 3 illustrates a perspective view of a memory device 300 of an example three-dimensional memory, in accordance with some embodiments.

FIG. 3 illustrates, in block diagram form, a perspective view of a memory 110, in an example three-dimensional (3-D) configuration. The 3-D memory 300 includes a set of blocks disposed on a substrate 302. For example, blocks BLK0, BLK1, BLK2, and BLK3 of memory cells are disposed on substrate 302. Peripheral areas 304 and 306 are also disposed within the substrate 302. The peripheral area 304 runs along an edge of each block while the peripheral area 302 is at the end of the set of blocks.

The peripheral areas 304 and 306 can include circuits used by the blocks. In some examples, the circuits include voltage drivers connected to control gate layers, bit lines and sources lines coupled to the blocks. The substrate 302 also includes circuits that are located under the blocks, along with one or more lower metal layers patterned in conductive paths to carry signals from the circuits. The blocks are formed in an intermediate region 308 of the memory 300, and an upper region 310 defines one or more metal layers patterned in conductive paths to carry signals of various circuits.

Each block includes a stacked area of memory cells, where alternative levels of the stack represent word lines. While four blocks are illustrated in FIG. 3, two or more blocks are used in various embodiments.

Figure 4:
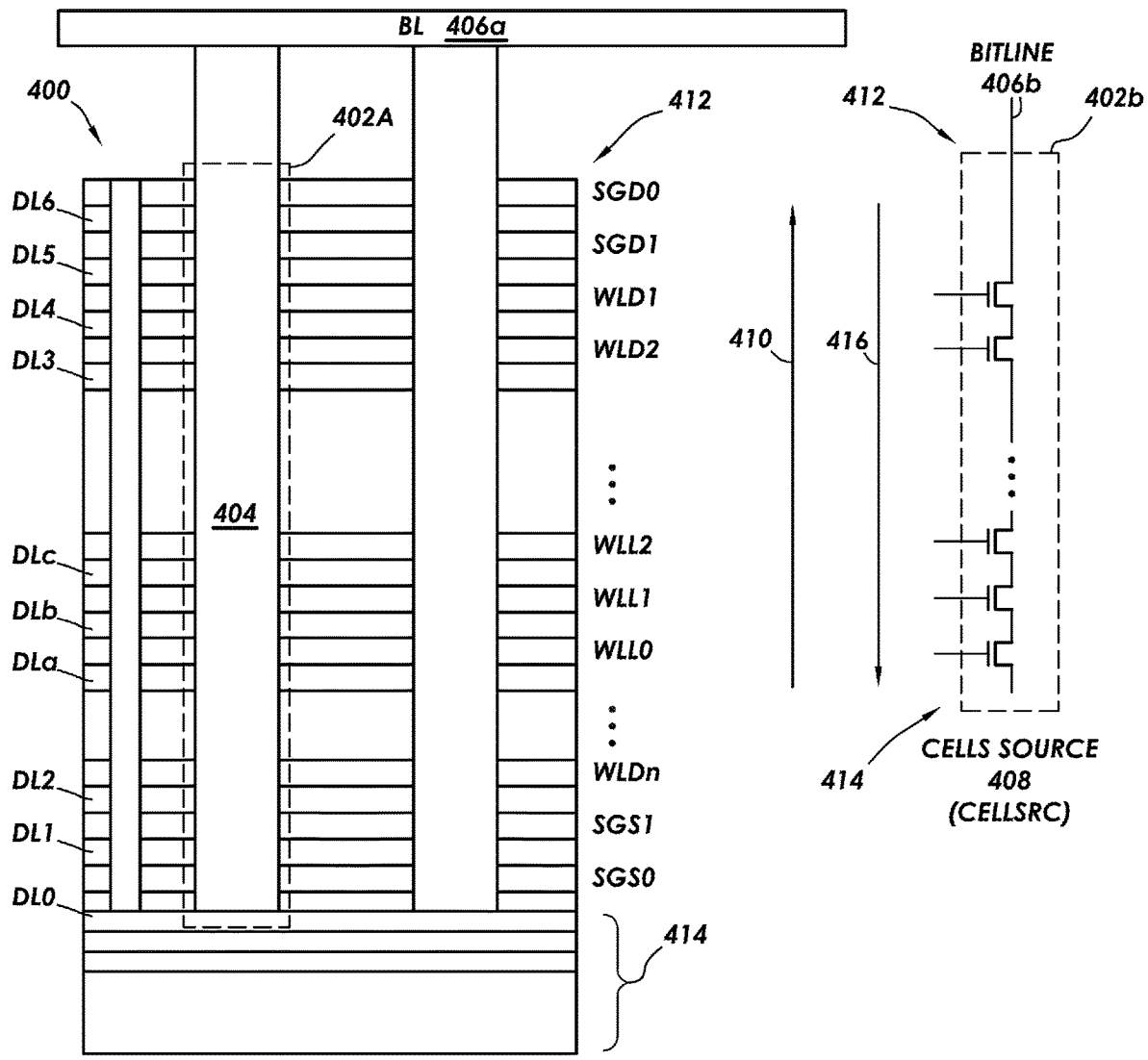
FIG. 4 illustrates an example cross-sectional view of a portion of a memory block, in accordance with some embodiments.

FIG. 4 illustrates an example cross-sectional view of a portion of one of the blocks of FIG. 2. The block includes a stack 400 of alternating conductive and dielectric layers. The block includes conductive layers spaced apart vertically, and the conductive layers define word-lines coupled to the memory cells. And select gate lines connected to SGD (select gate drain) and SGS (select gate source) transistors.

In the example illustrated in FIG. 4, the conductive layers include two SGD layers, two SGS layers, and dummy word lines WLD1, WLD2, and WLDn. The conductive layers also include several data word-lines including WLL0, WLL1, WLL2. The dielectric layers sandwiched between the conductive layers are identified as DL0, DL1, DL2, DLa, DLb, DLc, DL3, DL4, DL5, and DL6.

An example NAND string 402a includes a memory hole 404 which is formed from materials defining memory cells adjacent to the word-lines. The NAND string 402a is shown in an equivalent circuit form 402a. The NAND string 402a is illustrated by several transistors connected in series, each representing a memory cell within the NAND string 402. For the purposes of this description, a top of the NAND string 402 is coupled to a bit line 406, while a bottom of the NAND string 402 is coupled to a cell source 408. In FIG. 4, the top of the NAND string 402 is identified as top 412 while a bottom of the NAND string 402 is identified as bottom 414.

In one example, during a program operation, memory cells coupled to lower word-lines—word-lines at the bottom 414—are programmed first and programming proceeds by moving up the NAND string—toward the top 412. For purposes of this discussion, the order of programming in which a controller starts at the bottom of the NAND string and programs in a direction 410 toward the top of the NAND string is referred to as a "normal" direction of programming.

In other examples, during a program operation, memory cells coupled to higher word-lines—word-lines at the top 412—are programmed first and programming proceeds by moving down the NAND string—toward the bottom 414. For purposes of this discussion, the order of programming in which a controller starts at the top of the NAND string and programs in a direction 416 toward the bottom of the NAND string is referred to as a "reverse" direction of programming.

In order to read data out of a programmed word-line, one of at least two sensing operations may be used to perform a verify or read operation. The sensing operations enable a controller 104 to implement bi-directional sensing and include: a normal sensing operation, and a reverse sensing operation.

Figure 5:
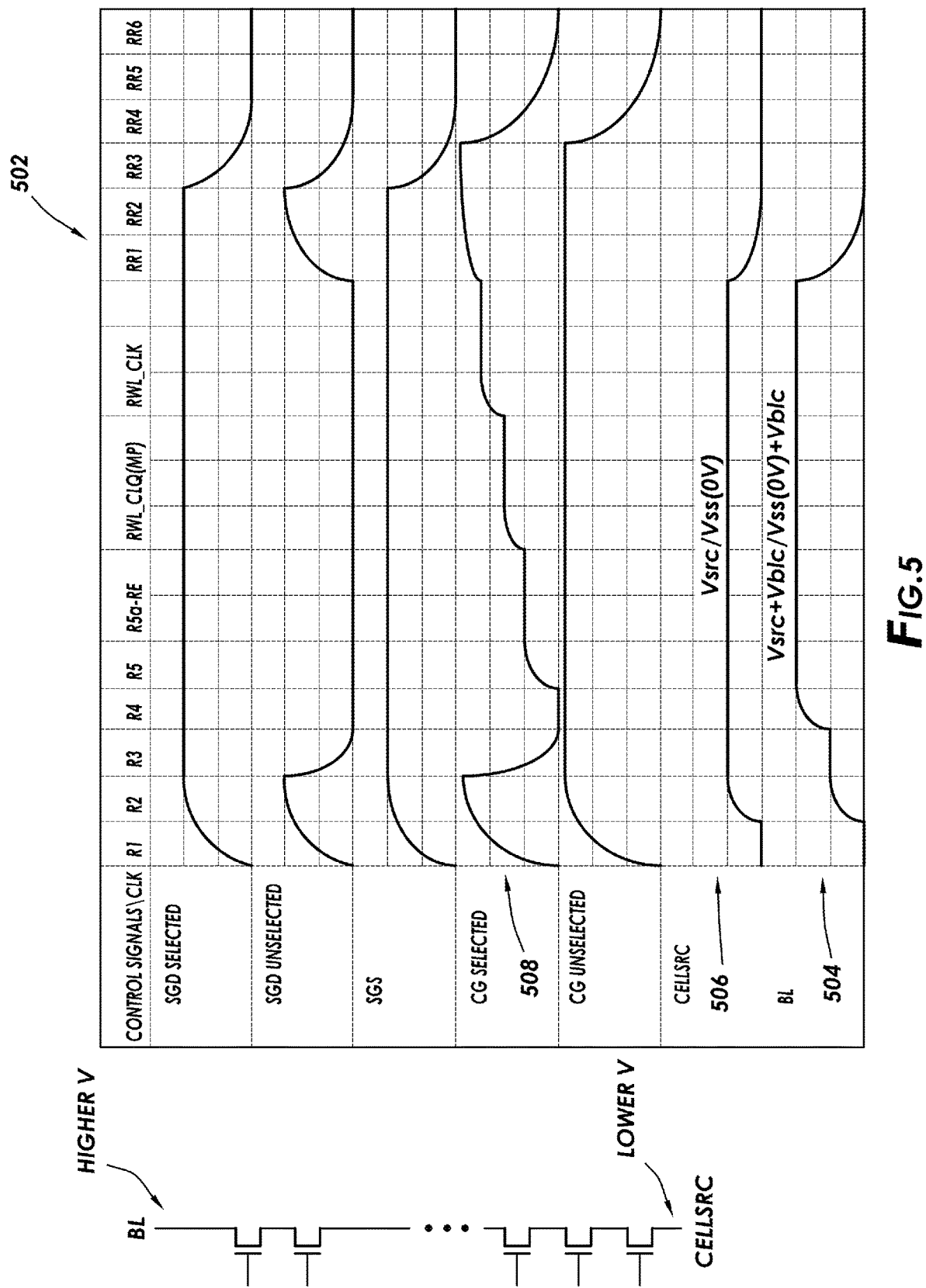
FIG. 5 illustrates an example plot associated with reading a memory, in accordance with some embodiments.

FIG. 5 illustrates example voltages applied to a NAND string during a normal sensing operation. During a normal sensing operation, the top of the NAND string is coupled to a higher voltage potential than the bottom of the NAND string. For example, the bit line 406 is coupled to a higher voltage than the cell source 408. A sensing operation in which the top of the NAND string (e.g., the bit line) is placed at a higher voltage potential than the bottom of the NAND string (e.g., the cell source) is referred to herein as a normal sensing operation.

The plot 502 illustrates an example embodiment, during which a read operation is performed using a normal sensing operation. In plot 502, an example voltage level applied to a bit line (BL) is: Vsrc+Vblc/Vss(0V)+Vblc, illustrated by line graph 504, and an example voltage level applied to cell source (CELLSRC) is Vsrc/Vss(0V), illustrated by line graph 506. With the top of the NAND string placed at a higher voltage potential than the bottom of the NAND string during the read operation, the control gates of selected memory cells receive increasing voltage steps, as shown by the line graph 504.

Figure 6:
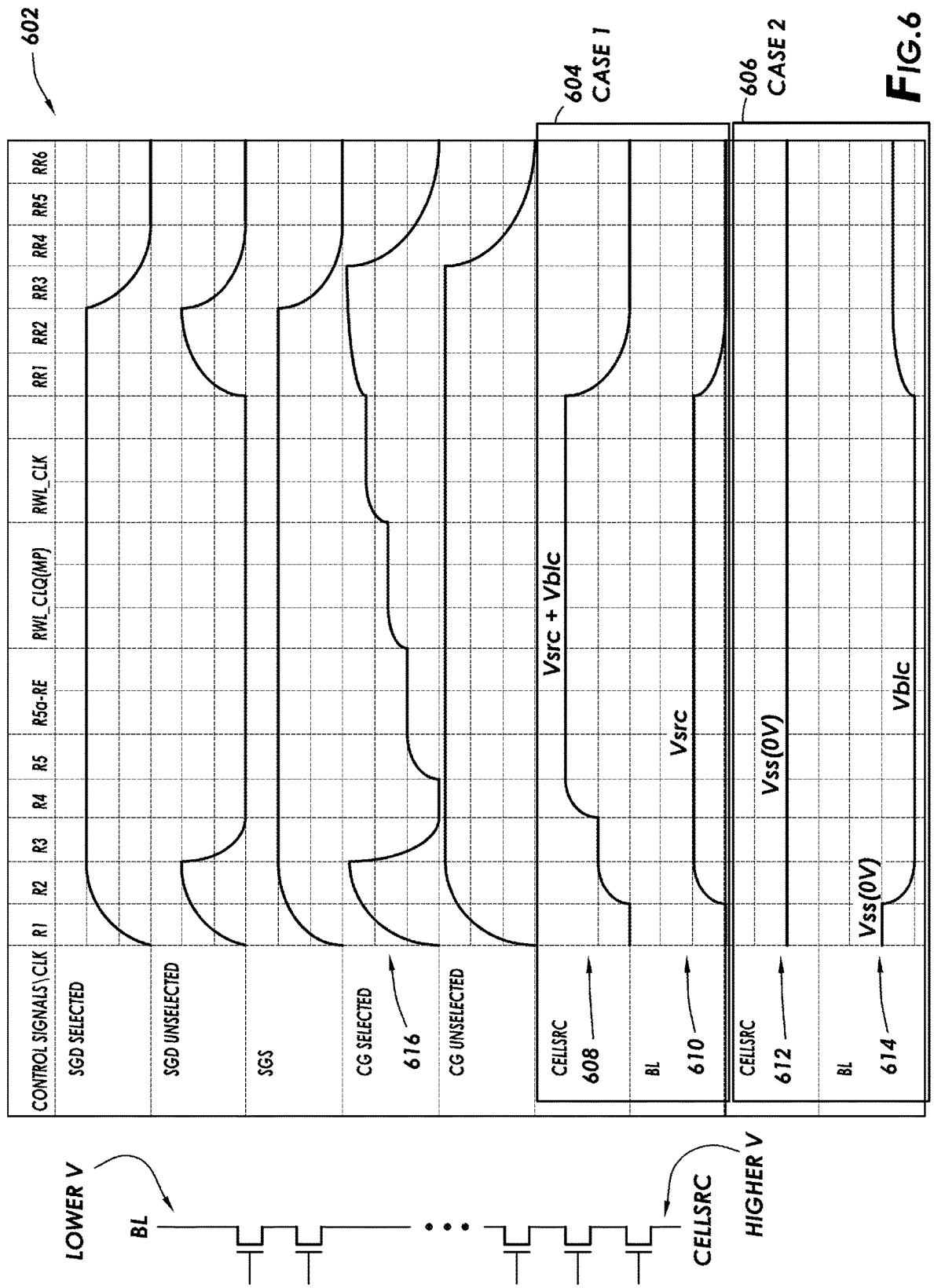
FIG. 6 illustrates an example plot associated with reading a memory, in accordance with some embodiments.

FIG. 6 illustrates example voltages applied to a NAND string during a reverse sensing operation. During a reverse sensing operation, the top of the NAND string is coupled to a lower voltage potential than the bottom of the NAND string. For example, the bit line 406 is coupled to a lower voltage than the cell source 408. A sensing operation in which the top of the NAND string (e.g., the bit line) is placed at a lower voltage potential than the bottom of the NAND string (e.g., the cell source) is referred to herein as a reverse sensing operation.

FIG. 6 illustrates two examples embodiments used to implement a reverse sensing operation. In both examples, the top of the NAND string is placed at a lower voltage potential than the bottom of the NAND string. In a first example 604, during a read operation, an example voltage level applied to cell source (CELLSRC) is Vsrc+Vblc, illustrated by line graph 608, and an example voltage level applied to a bit line (BL) is Vsrc illustrated by line graph 610.

In a second example 606, during a read operation, an example voltage level applied to cell source (CELLSRC) is Vss, where Vss is a non-negative voltage such as zero voltages—illustrated by line graph 612. In the second example 606, an example voltage level applied to a bit line (BL) is a negative voltage value such as—Vblc, illustrated by line graph 614. In various embodiments, a negative voltage is applied to the bit line using triple-well technology. With the top of the NAND string placed at a lower voltage potential than the bottom of the NAND string during the read operation, the control gates of selected memory cells receive increasing voltage steps, as shown by the line graph 616.

In various embodiments, triple-well technology—used to generate negative voltages—is formed within a substrate that defines a P conductivity type silicon—e.g., a p-substrate. The p-substrate defines various regions including a deep n-well. The deep n-well in turn defines a p-well with three regions. The deep n-well defines additional regions. The p-substrate additionally defines an n-well region which in turn defines three regions. In one example, the triple-well technology generates the negative voltage applied to the bit line in the second example 606.

As described herein, during the operation of the memory 110, a controller 104 may selectively apply a normal sensing operation or a reverse sensing operation to a particular word line. The controller 104 may determine which sensing operation to apply based on a various factors including: a location of the word-line to be read in the memory 110 ("a target word-line"), a number of neighboring word-lines, a state of the neighboring word-lines around the time of the sensing operation, and a programming order used to program the target word-line.

For purposes of this discussion, when a sensing operation is used that is performed in a direction that is opposite a direction of programming, the sensing operation may be referred to as smart sensing. To clarify, smart sensing occurs in two cases: normal direction of programming paired with a reverse sensing operation; and reverse direction of programming paired with a normal sensing operation.

As memory shrinks in size with advances in technology, and as the dielectric and conductive layers shrink, memory 110 experiences an increase in phenomenon related to neighboring word-line interference. For example program and read operations may be impacted by neighboring word-line interference. In particular and as described in FIG. 7, neighboring word-line interference impacts a result of a read or verify operation. However, through the use of bi-directional sensing, the impact of the neighboring word-line interference may be reduced.

Figure 7:
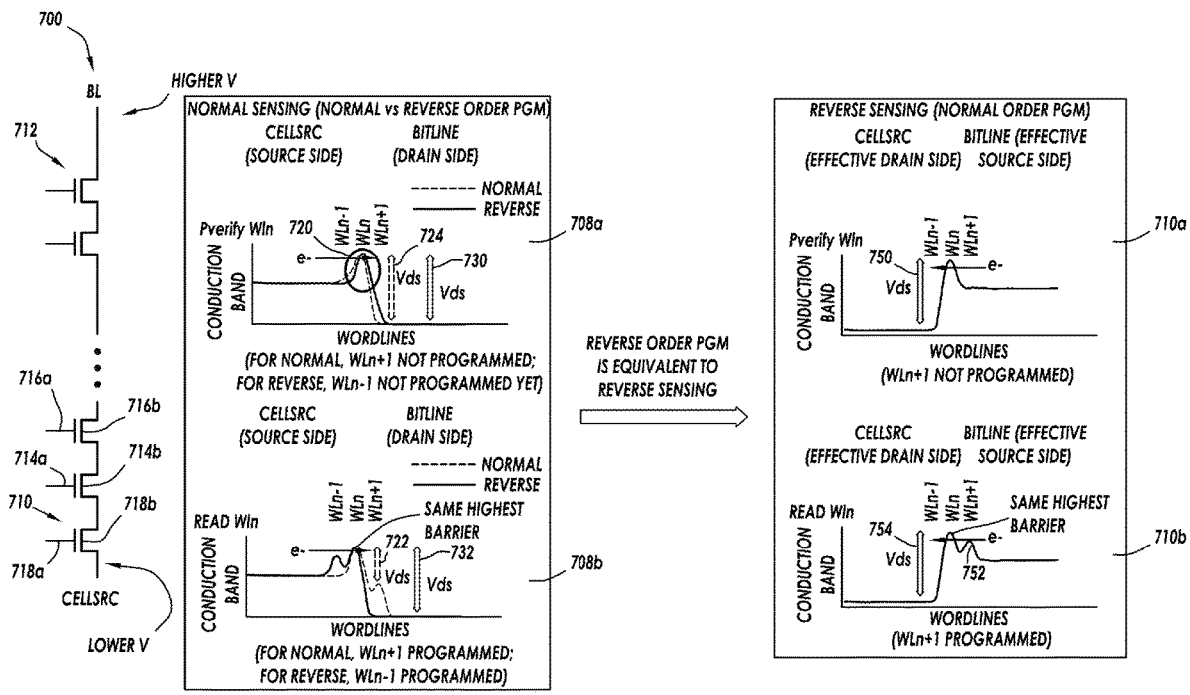
FIG. 7 illustrates example plots associated with reading a memory, in accordance with some embodiments.

FIG. 7 illustrates various combinations of programming order and sensing operations. Representative NAND string 700 illustrates a scenario where a normal sensing operation is used to read data. As the NAND string 700 is read using a normal sensing operation, the top of the NAND string 700 is placed at a higher voltage potential than the bottom of the NAND string.

The plots 708a and 708b demonstrate various aspects of performing a normal sensing operation on a NAND string 700. Two aspects of programming and reading are varied between the two plots 708a and 708b.

The first aspect relates to direction of programming. Each of the plots 708a and 708b illustrate both scenarios including programming the NAND string 700 using a normal direction of programming (illustrated using a dashed line) and using a reverse direction of programming (illustrated using a solid line). As described herein, when programming using a normal direction of programming, a controller initially begins near the bottom 710 of the NAND string and progressively moves up toward the top 712. When programming using a reverse direction of programming, a controller initially begins near the top 712 of the NAND string and progressively moves toward the bottom 710 of the NAND string. In the plots 708a and 708b, data associated with programming using a normal direction of programming are captured by the lines including line markers with an "X", while data associated with programming using a reverse direction of programming are captured by the lines with no line markers.

The second aspect relates to whether the sensing is performed as part of a verify operation or a read operation. As used herein, a verify operation occurs during a programming operation and is used to verify that a memory is programmed to a target level. In contrast, a read operation occurs as part of a read used to extract the data stored in the memory cell. Furthermore, when a verify operation is performed, a NAND string is in one state, while when a read operation is performed, the NAND string is in a second, different state. For the sake of this description, when a verify operation is performed, the NAND string is in a programming state, while when a read operation is performed, the NAND string is in a programmed stated.

When a NAND string is in a programming state (during which verify operations are performed), not all word-lines in the NAND string may be programmed. For example, in the case where a controller performs a normal direction of programming, the controller begins by programming the memory cell 718b coupled to the word-line 718a. While the memory cell 718b is programmed, the memory cells above memory cell 718b are not programmed.

Subsequently, the controller programs the memory cell 714b coupled to the word-line 714a. While the memory cell 714b is programmed, the memory cell 718b remains programmed, while the memory cells above memory cell 714b (e.g., memory cell 716b) are not programmed. Accordingly, when the NAND string is in a programming state, not all word-lines in the NAND string may be programmed.

When a NAND string is in a programmed state (during which read operations are performed), the word-lines in the NAND string are all programmed. The impact of neighboring word-line interference varies based on a state of the NAND string, a direction of programming, and type of sensing operation—e.g. whether smart sensing used.

Plot 708a illustrates aspects of the device physics occurring during a verify operation between word-line WLn, word-line WLn−1 and word-line WLn+1. The plot 708a illustrates phenomenon occurring when the controller 104 programs the NAND string using a normal direction of programming and performs a verify using a normal sensing operation—not a smart sensing scenario. Additionally, the plot 708a illustrates a smart sensing scenario, wherein the controller 104 programs the NAND string using a reverse direction of programming and performs a verify using a normal sensing operation.

In the plot 708a, the x-axis illustrates values associated with different word-lines of the NAND string, and the y-axis illustrates values associated with a conduction band. In both scenarios, as the sensing operation is performed during a verify operation, the NAND string is in a programming state. Taking an example where word-line WLn is word-line 714a, word-line WLn−1 is word-line 718a, and word-line WLn+1 is word-line 716a, the word-lines 718a and 714a are programmed while the word-line 716a is not.

With regards to a first scenario that does not include smart sensing, a controller programs the NAND string using a normal direction of programming and a normal sensing operation. When the controller 104 performs a verify operation on word-line WLn (e.g., word line 714a), the conduction bandgap value associated with word-line WLn−1 (programmed) is slightly elevated and forms a smooth horizontal line in the line graph. The conduction bandgap value associated with the word-line WLn (programmed) during the verify operation forms a bump in the line graph where the conduction bandgap value is higher than the value of the conduction bandgap associated with word-line WLn−1 (programmed). The region 720 defines the area in the line graph capturing the conduction band values of the word line WLn−1 and WLn.

Additionally, the conduction bandgap values of the word-lines WLn+(not programmed) are at a lower value, comparable to each other, and form a smooth horizontal line. Accordingly, the line remains fairly flat for word-line values WLn+. In this example, an example Vds 724 is the difference between the conduction bandgap values associated with the word-line WLn+ (not programmed) and the conduction bandgap value associated with word-line WLn (programmed).

Continuing the example first scenario—which does not include smart sensing—the plot 708b illustrates changes in the conduction band values after all word-lines have been programmed and during a read of the word-line WLn at a subsequent time after programming. Similar to plot 708a, the plot 708b illustrates phenomenon occurring in both a not smart sensing scenario and a smart sensing scenario. The difference between the two plots, is the plot 708b illustrates phenomenon occurring during a read instead of a verify operation.

In the plot 708b, the x-axis illustrates values associated with different word-lines of the NAND string, and the y-axis illustrates values associated with a conduction band. In both scenarios, as the sensing operation is performed during a read operation, the NAND string is in a programmed state. Taking the example where word-line WLn is word-line 714a, word0line WLn−1 is word-line 718a, and word-line WLn+1 is word-line 716a, all word-lines are programmed.

During the read, similar to the verify example, a normal sensing operation is used. During the read, the conduction band value associated with word-line WLn−1 remains the same, while a bump associated with word-line WLn+1 (programmed) is formed. That is, the conduction band value associated with the word-line WLn+1 is higher than it was during the verify operation. Accordingly, during a read of word-line WLn using a normal sensing operation—in the example first scenario—a reduced Vds 722 is observed.

In various embodiments, the phenomenon described occurs due to neighboring word-line interference (NWI). In one example of neighboring word-line interference, if one memory element is programmed first and a neighboring memory element (or second memory element) is programmed later, the program-level of the first memory element is influenced by the program amount of the second memory element.

In contrast, a different phenomenon is observed in the case of a second scenario—that includes smart sensing—in this example the controller 104 programs the NAND string using a reverse direction of programming and a normal sensing operation. With regards to this smart sensing example, a controller programs the NAND string using a reverse direction of programming—programming from top to bottom—the word-lines 716a and 714a have been programmed while word-line 718a has not been programmed.

As illustrated in the plot 708a, when the controller 104 performs a verify operation on word-line WLn (programmed) using a normal sensing operation, the conduction bandgap value associated with word-line WLn−1 (not programmed) is not slightly elevated and does not form a bump in the line graph. The bump associated with the conduction bandgap value associated with the word-line WLn is similar to the scenario—that does not include smart sensing. Furthermore, the conduction bandgap value associated of the word-lines WLn+ (programmed) during the verify operation are at a lower value—than the conduction bandgap value associated with the word-line WLn—and comparable to each other. Similar to the scenario that does not include smart sensing—the conduction bandgap values associated with the word-line WLn+ (programmed) remain fairly flat.

In this example, an example Vds 730 is the difference between the conduction bandgap values associated with the word-line WLn+(programmed) and the conduction bandgap value associated with word-line WLn (programmed). The example Vds 730 is comparable to the Vds 724 (associated with the first scenario which does not include smart sensing).

Continuing the example second scenario—which includes smart sensing—the plot 708b illustrates changes in the conduction band values after all word-lines have been programmed and during a read of the word-line WLn at a time after programming.

During the read, similar to the verify example in the second scenario, a normal sensing operation is used. During the read, unlike the example in which smart sensing is not used, in the smart sensing case, the Vds 732 remains comparable to Vds 730—associated with the verify operation. The Vds 732 defines the difference between the conduction bandgap values associated with the word-line WLn+ (programmed) and the conduction bandgap value associated with word-line WLn (programmed).

Of note, during the read, a bump is associated with the word-line WLn−1 (programmed) is formed. That is, the conduction band value associated with the word-line WLn−1 is higher than it was during the verify operation.

The plot 708b illustrates how using smart sensing can reduce the impacts of neighboring word-line interference. That is, in the first scenario—that did not include smart sensing—the Vds value decreases after the word-line WLn+1 is programmed. In contrast, in the second scenario—which include smart sensing—the Vds value remains largely unchanged between the verify and read operations.

The plots 710a and 710b illustrate that in a third scenario—that uses smart sensing with a normal direction of programming—the same benefits are realized as the second scenario. In the third scenario—that includes smart sensing—the controller 104 programs the NAND string using a normal direction of programming and reverse sensing operation. With regards to this smart sensing example, a controller programs the NAND string using a normal direction of programming—programming from bottom to top—the word-lines 718a and 714a have been programmed while word-line 716a has not been programmed.

In both plots 710a and 710b, respective x-axis illustrates values associated with different word-lines of the NAND string, and respective y-axis illustrates values associated with a conduction band. As illustrated in the plot 710a, when the controller 104 performs a verify operation on word-line WLn (programmed) using a reverse sensing operation, the conduction bandgap value associated with the word-line WLn−1 (programmed) is lower while a bandgap value associated with the word-line WLn (programmed) is higher. The value Vds 750 defines the difference between the conduction bandgap values associated with the word-line WLn−1 (programmed) and the word-line WLn (programmed).

The plot 710b illustrates changes in the conduction band values after all word-lines have been programmed and during a read of the word-line WLn at a time after programming. During a read operation performed on the word-line WLn, the conduction bandgap value associated with the word-line WLn+1 is slightly elevated (bump 752), however the Vds 754 remains similar to the Vds 750. That is, the difference between the conduction bandgap values associated with the word-line WLn−1 and the word-line WLn remains similar. That is, the effect of neighboring word-line interference is reduced. Accordingly, methods that use smart sensing can help reduce the impact of neighboring word-line interference.

Figure 8A:
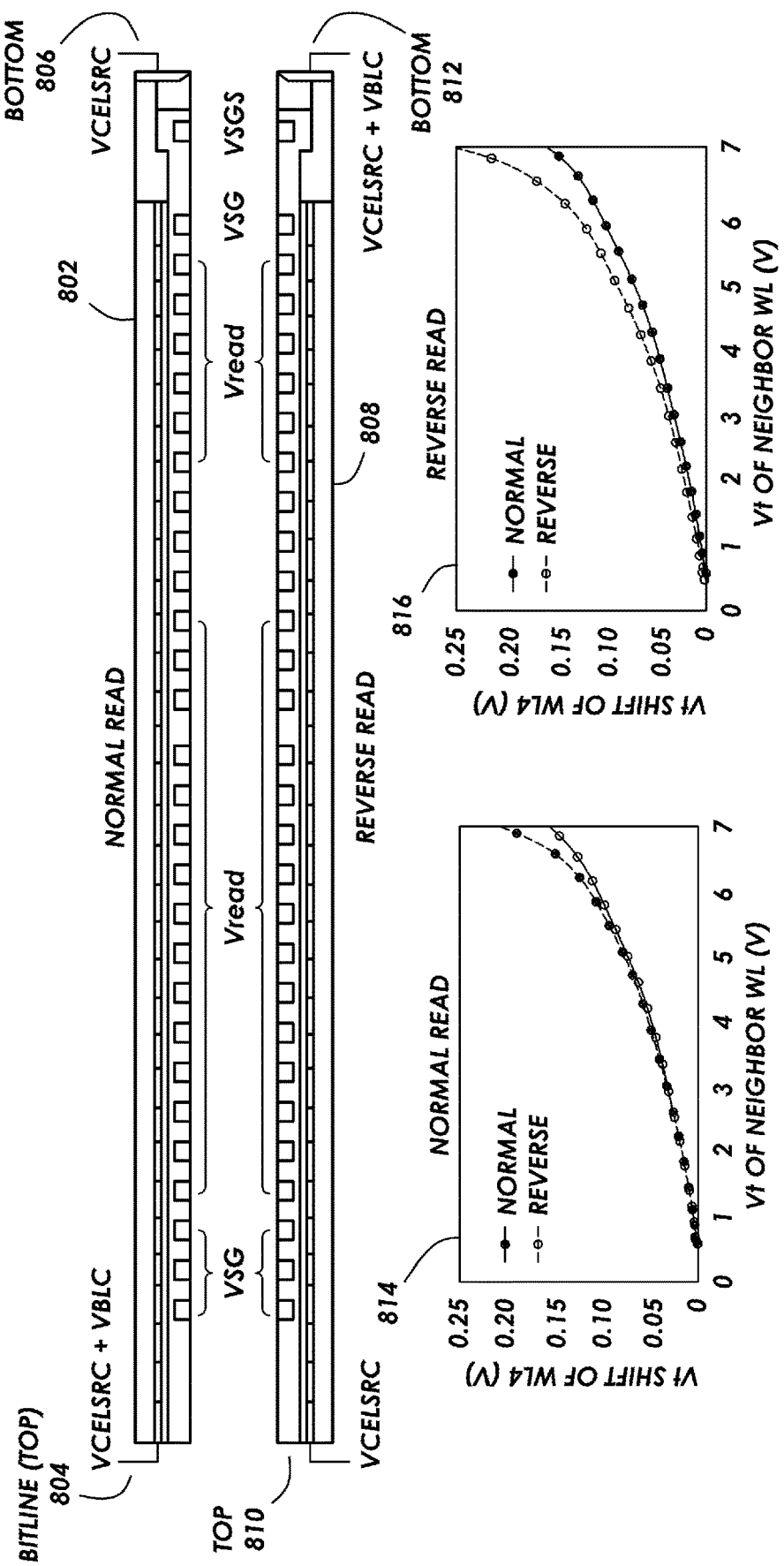
FIG. 8a illustrates example plots associated with reading a memory, in accordance with some embodiments.

FIG. 8a illustrates example embodiments in which the different sensing operations are performed. Furthermore, FIG. 8a illustrates plots related to the different sensing operations. In particular, NAND string 802 is biased such that a normal sensing operation is performed. In particular, the top 804 of the NAND string 802 is biased to VCELSRC+VBLC, while the bottom 806 of the NAND string 802 is biased to VCELSRC.

The NAND string 808 is biased such that a reverse sensing operation is performed. In particular, the top 810 of the NAND string 808 is biased to VCELSRC while the bottom 812 of the NAND string 808 is biased to VCELSRC+VBLC.

The plots 814 and 816 illustrate the impacts of combining the different types of sensing with different directions of programming. In both plots 814 and 816, respective x-axis illustrates voltage threshold values of neighbor word-lines, and respective y-axis illustrates values associated with a voltage threshold shift of a particular word-line WL4.

The plot 814 illustrates examples where a read is performed using a normal sensing operation, while the plot 816 illustrates examples where a read is performed using a reverse sensing operation. In the plot 814—where a read is performed using a normal sensing operation—a greater voltage threshold shift is observed where a normal direction of programming is paired with a normal sensing operation. That is, a greater voltage threshold shift is observed where smart sensing does not occur. In contrast, a lesser voltage threshold shift is observed where a reverse direction of programming is paired with a normal sensing operation—a smart sensing scenario.

In the plot 816—a read is performed using a reverse sensing operation. In the plot 816 a greater voltage threshold shift is observed where a reverse direction of programming is paired with a reverse sensing operation. Again, a greater voltage threshold shift is observed where smart sensing does not occur. And again, in contrast, a lesser voltage threshold shift is observed where a normal direction of programming is paired with a reverse sensing operation—a smart sensing scenario.

Figure 8B:
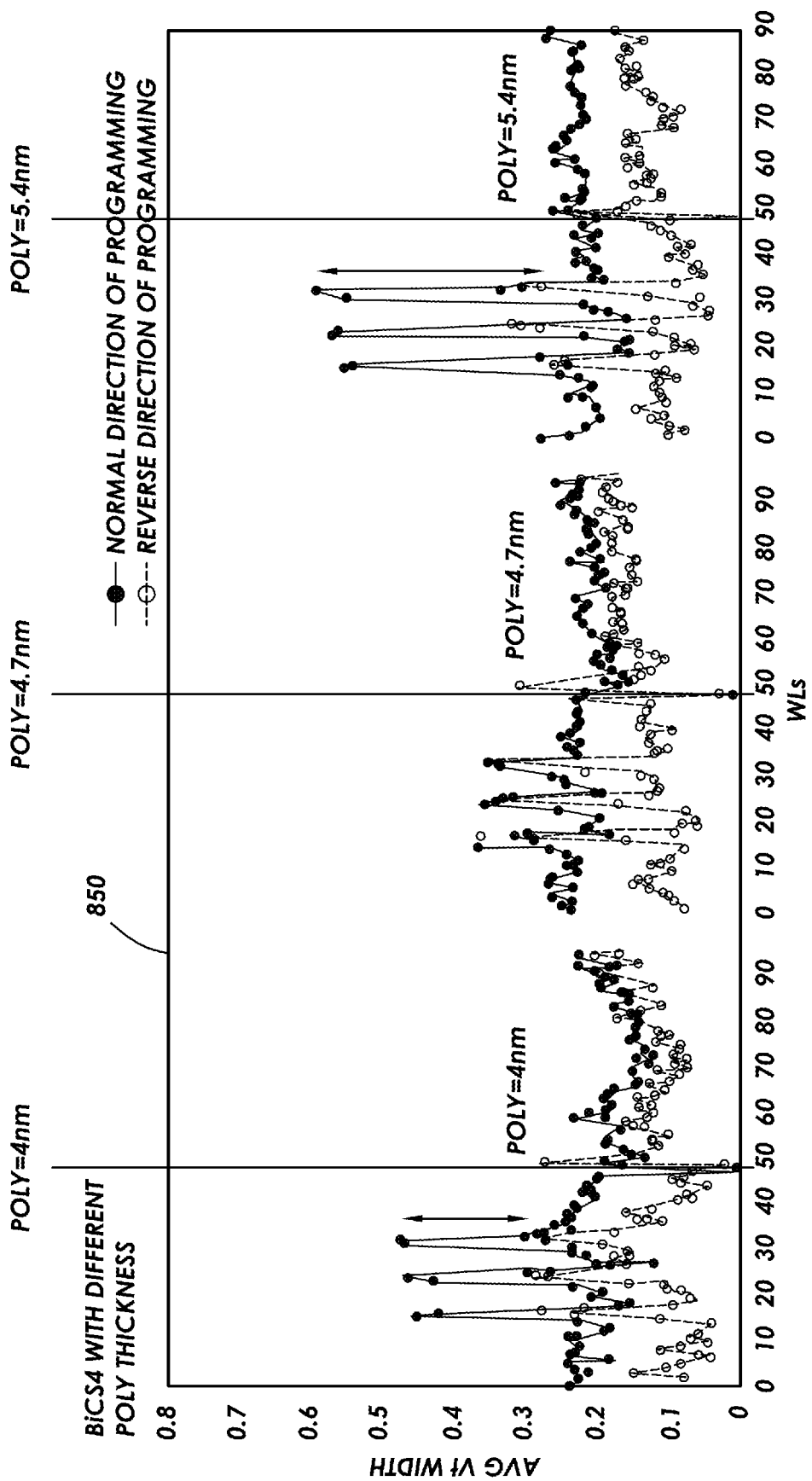
FIG. 8b illustrates example plots associated with reading a memory, in accordance with some embodiments.

FIG. 8b illustrates a plot 850 which illustrate scenarios where smart sensing might be beneficial and where smart sensing is less helpful. The x-axis of the plot 850 illustrates various word-lines, while the y-axis of the plot 850 illustrates example average Vt widths with a normal sensing operation. As illustrated in the plot 850, some word-lines experience reduced Vt width with smart sensing—e.g., a reverse direction of programming paired with a normal sensing operation—while other word-lines experience increased Vt width with smart sensing. That is, these other word-lines experience a lower Vt width when a normal direction of programming is paired with a normal sensing operation, than when a reverse direction of programming is paired with normal sensing operation (e.g., word-line 49 and some others).

Thus, methods described herein can use a dynamic sensing operation that implements bi-directional sensing. The bi-directional sensing can be implemented in a dynamic manner that switches between smart sensing and not based on various factors. For example, in cases where a read is improved by smart sensing, a controller 104 is configured to read using smart sensing, while cases where a read is negatively impacted by smart sensing, the controller 104 is configured to read in a manner that does not utilize smart sensing.

In some examples, the controller may determine a neighboring word-line interference associated with a particular word-line and determine whether to perform a sensing operation that incorporate smart sensing. For example, the controller 104 is configured to determine a neighboring word-line interference associated with a second word-line is above a threshold; and in response the controller 104 applies smart sensing. In another example, the controller is configured to determine a neighboring word-line interference associate with a second word-line is below a threshold, and in response the controller 104 applies a normal sensing operation to a second word-line.

In some embodiments, a controller 104 applies smart sensing based on a location of the word-line within the three-dimensional memory array. For example, the controller 104 determines where the word-line is disposed within a memory string. In other examples, the controller 104 determines a neighboring word-line interference based on a location of a word-line within a memory string. In other embodiments, the controller 104 determines whether to apply smart sensing based on data gathered such as in plot 850.

In yet other embodiments, the controller is configured to apply—as a default—sensing operations that do not incorporate smart sensing. Upon receiving a high bit error rate associated with a particular read of a particular word-line, the controller 104 applies smart sensing to read the data out of the particular word-line. In additional embodiments, the controller is configured to apply—as a default—sensing operation that implement smart sensing. Upon receiving a high bit error rate associated with a particular read of a particular word-line, the controller 104 reads the data out of the particular word-line without using smart sensing.

In yet other embodiments, a controller is configured to apply the same type of sensing (e.g., normal sensing operation, reverse sensing operation) for verify operations while switching the type of sensing during a subsequent read operation. For example, a controller may utilize a normal sensing operation during a verify operation while programming a first and second word-lines. During subsequent read operations, the controller may utilize a reverse sensing operation to read the first or second or both word-lines. Thus any combination of the sensing operation may be used throughout verify and read operations. The above examples are meant for illustrative purposes. Any scenario in which bi-direction sensing is utilized is contemplated by this disclosure.

Figure 9:
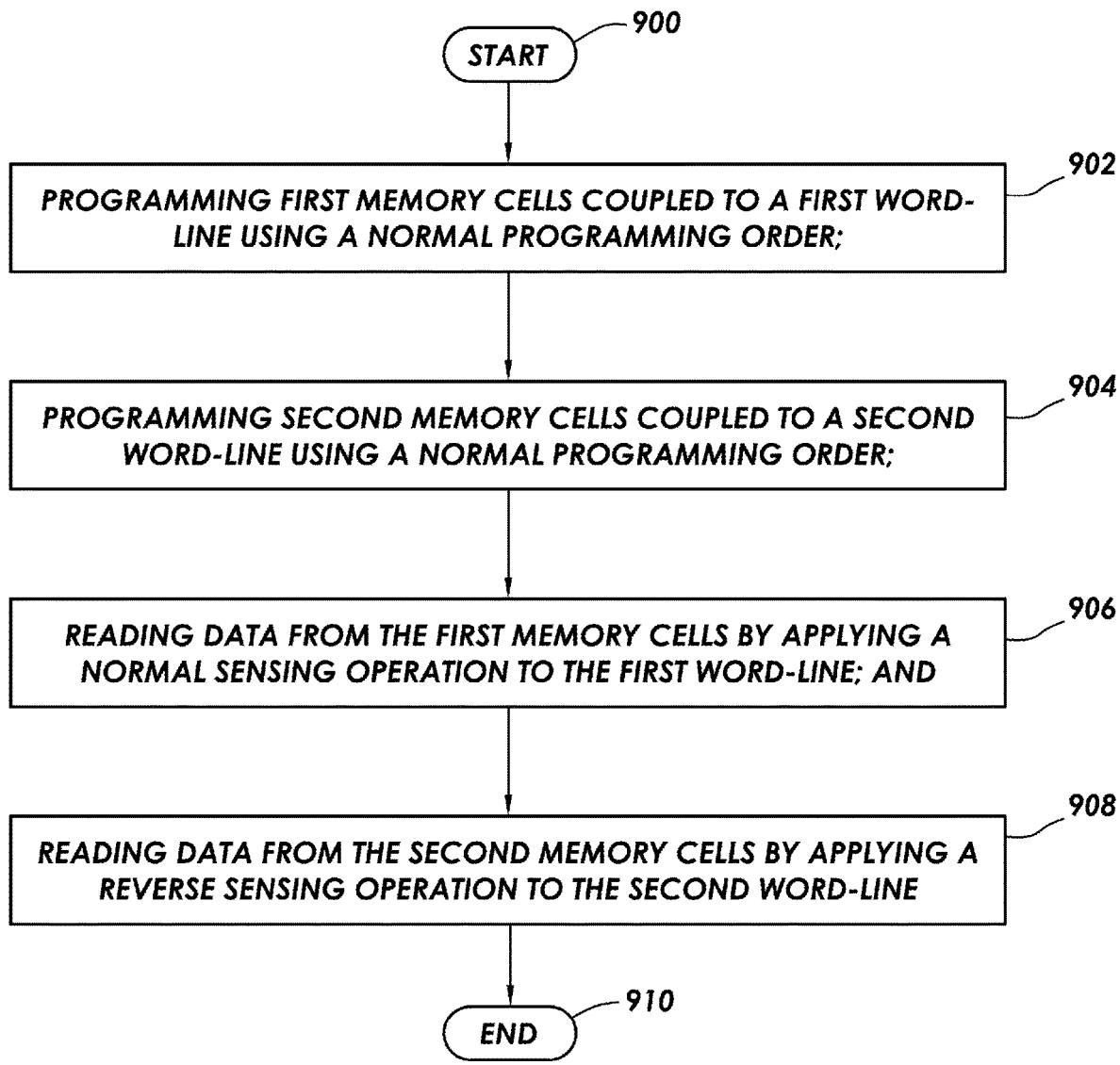
FIG. 9 illustrates a method diagram, in accordance with some embodiments.

FIG. 9 shows a method in accordance with at least some embodiments. In particular, the method is performed at a memory system (e.g., the storage system 102) and includes programming first memory cells coupled to a first word-line using a normal programming order (block 902); programming second memory cells coupled to a second word-line using a normal programming order (block 904); reading data from the first memory cells by applying a normal sensing operation to the first word-line (block 906); and reading data from the second memory cells by applying a reverse sensing operation to the second word-line (block 908). Thereafter the method ends (block 910).

Figure 10:
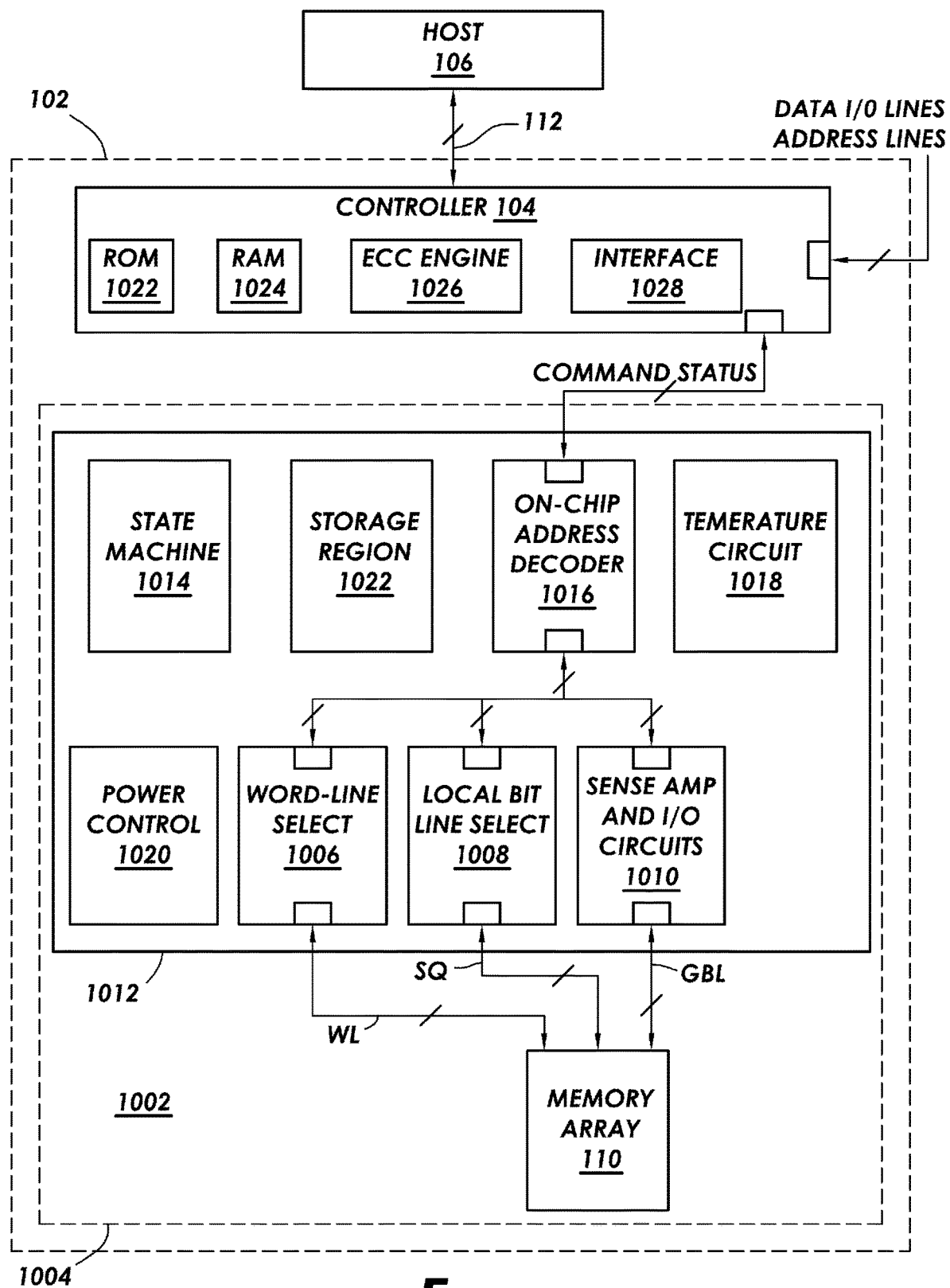
FIG. 10 illustrates a block diagram of an example memory system, in accordance with some embodiments.

FIG. 10 shows in block diagram form, an illustrative memory system such as memory system 102. The memory system 102 can include the controller 104 and one or more memory die 1002. The controller 104 or memory die 1002 may be formed on a single substrate (e.g., substrate 1004). Additionally the functionality of the controller 104 or memory die 1002 may be embodied on multiple substrates co-packaged and electrically coupled to each other and the various terminals.

The example memory die 1002 includes the memory 110 which is addressable by word line via word line select 1006 and a row decoder, and by bit lines via local bit line select 1008 and a column decoder. The word line select 1006 and the local bit line select 1008 form part of control circuitry 1012. The control circuitry 1012 cooperates with the read/write circuits of memory 110 and includes a state machine 1014, an on-chip address decoder 1016, a temperature-sensing circuit 1018, and a power control module 1020. The state machine 1014 provides chip-level control of memory operations.

A storage region 1022 stores operational parameters and software/code. In one embodiment, the state machine is programmable by the software. In other embodiments, the state machine does not use software and is completely implemented in hardware (e.g., electrical circuits).

The on-chip address decoder 1016 provides an address interface between that used by a controller to the hardware address used by the by memory 110. The temperature-sensing circuit 1018 detects a temperature of the memory 110. The temperature can be used for a variety of purposes including used to adjust voltages and parameters used with reading or programming.

The power control module 1020 controls the power and voltages supplied to the word lines, select gate lines, bit lines and source lines during operation of the memory 110. In one example, the sense amplifier and I/O circuits 1010 provide (during programming) and receive (during reading) analog electrical quantities in parallel over the global bit lines, that are representative of data stored in addressed memory elements Mzxy. The circuits 1010 contain sense amplifiers for converting the electrical quantities into digital data value during reading, which digital data value are then conveyed to the memory controller 104.

Data to be programmed into the memory 110 are sent by the controller 104 to the sense amplifier and I/O circuits 1010 by way of the on-chip address decoder 1016, which then programs that data into addressed memory elements.

The controller 104 may include ROM 1022, RAM 1024, and an error-correction code (ECC) engine 1026. The ECC engine 1026 can correct a number of read error. A memory interface 1028 may also be implemented within the controller 104. The memory interface 1028, in communication with the ROM 1022 and RAM 1024 provides an electrical interface between the controller 104 and the memory die 1002. For example, the memory interface 1028 can change the format or timing of signals, provide a buffer, isolate from surges, latch I/O, and so forth.

Although the memory system of FIG. 10 utilizes the three-dimensional memory 110 of FIG. 1, the system is not limited to use of only that array architecture. A given memory system may alternatively combine this type of memory with other types including flash memory, such as flash having a NAND memory cell array architecture, a magnetic disk drive, or some other type of memory. The other type of memory may have its own controller or may in some cases share the controller 104 with the three-dimensional memory 110, for example if there is some compatibility between the two types of memory at an operational level.

The above discussion is meant to be illustrative of the principles and various embodiments described herein.

Numerous variations and modifications will become apparent to those skilled in the art once the above disclosure is fully appreciated. For example, although a controller 104 has been described as performing the methods described above, any processor executing software within a host system can perform the methods described above without departing from the scope of this disclosure. In particular, the methods and techniques described herein as performed in the controller, may also be performed in a host. Furthermore, the methods and concepts disclosed herein may be applied to other types of persistent memories other than flash. It is intended that the following claims be interpreted to embrace all such variations and modifications.

What is claimed is:

1. A method of reading a memory using bi-directional sensing, comprising:
   programming first memory cells coupled to a first word-line using a normal programming order;
   programming second memory cells coupled to a second word-line using a normal programming order;
   reading data from the first memory cells by applying a normal sensing operation to the first word-line where current flows through the first memory cells in a first direction; and
   reading data from the second memory cells by applying a reverse sensing operation to the second word-line where current flows through the second memory cells in a second direction that is opposite of the first direction.

2. The method of claim 1, further comprising:
   determining a neighboring word-line interference associated with a word-line neighboring the second word-line is above a threshold; and in response,
   applying the reverse sensing operation to the second word-line.

3. The method of claim 2, wherein the neighboring word-line interference is determined based on a location of the second word-line within a memory string.

4. The method of claim 1, wherein programming the second memory cells further comprises verifying data programmed to the second memory cells by applying a reverse sensing operation to the second word-line.

5. The method of claim 4, wherein programming the first memory cells further comprises verifying data programmed to the first memory cells by applying a normal sensing operation to the first word-line.

6. The method of claim 1, further comprising:
   receiving an error associated with reading the data from the first memory cells; and then
   reading the data from the first memory cells by applying a reverse sensing operation to the first word-line.

7. The method of claim 1, further comprising:
   receiving an error associated with reading the data from the second memory cells; and then
   reading the data from the second memory cells by applying a normal sensing operation to the second word-line.

8. A memory controller, comprising:
   a first terminal coupled to a memory array;
   the memory controller configured to:
      program first memory cells coupled to a first word-line using a normal programming order;
      program second memory cells coupled to a second word-line using a normal programming order;
      read data from the first memory cells by applying a normal sensing operation to the first word-line where current flows through the first memory cells in a first direction; and read data from the second memory cells by applying a reverse sensing operation to the second word-line where current flows through the second memory cells in a second direction that is opposite of the first direction.

9. The memory controller of claim 8, wherein the memory controller is further configured to:
   determine a neighboring word-line interference associated with a word-line neighboring the second word-line is above a threshold; and in response to the determining,
   apply the reverse sensing operation to the second word-line.

10. The memory controller of claim 9, wherein the neighboring word-line interference is determined based on a location of the second word-line within a memory string.

11. The memory controller of claim 8, wherein when the memory controller programs the second memory cells, the memory controller is further configured to:
   verify data programmed to the second memory cells by applying a reverse sensing operation to the second word-line.

12. The memory controller of claim 11, wherein when the memory controller programs the first memory cells, the memory controller is further configured to:
   verify data programmed to the first memory cells by applying a normal sensing operation to the first word-line.

13. The memory controller of claim 8, wherein the memory controller is further configured to:
   receive an error associated with reading the data from the first memory cells; and then
   read the data from the first memory cells by applying a reverse sensing operation to the first word-line.

14. A non-volatile storage system, configured to perform bi-directional sensing to read a memory, comprising:
   a memory comprising a three-dimensional memory array;
   a controller coupled to the memory array, wherein the controller is configured to:
      program first memory cells coupled to a first word-line using a normal programming order;
      program second memory cells coupled to a second word-line using a normal programming order;
      read data from the first memory cells by applying a reverse sensing operation to the first word-line where current flows through the first memory cells in a first direction; and
      read data from the second memory cells by applying a normal sensing operation to the second word-line where current flows through the second memory cells in a second direction that is opposite of the first direction.

15. The non-volatile storage system of claim 14, wherein the controller is further configured to:
   determine a neighboring word-line interference associated with a word-line neighboring the second word-line is below a threshold; and in response to the determination,
   apply the normal sensing operation to the second word-line.

16. The non-volatile storage system of claim 15, wherein the neighboring word-line interference is determined based on a location of the second word-line within a memory string.

17. The non-volatile storage system of claim 14, wherein when the controller programs the second memory cells, the controller is further configured to:
   verify data programmed to the first memory cells by applying a reverse sensing operation to the second word-line.

18. The non-volatile storage system of claim 17, wherein when the controller programs the first memory cells, the controller is further configured to:
   verify data programmed to the second memory cells by applying a normal sensing operation to the first word-line.

19. The non-volatile storage system of claim 14, wherein the controller is further configured to:
   receive an error associated with reading data from the first memory cells; and then
   read the data from the first memory cells by applying a normal sensing operation to the first word-line.

20. The non-volatile storage system of claim 14, wherein the controller is further configured to:
   receive an error associated with reading data from the second memory cells; and then
   read the data from the second memory cells by applying a reverse sending operation to the second word-line.

\* \* \* \* \*